(12) United States Patent
Loopstra et al.

(10) Patent No.: US 7,515,281 B2
(45) Date of Patent: Apr. 7, 2009

(54) LITHOGRAPHIC APPARATUS AND DEVICE MANUFACTURING METHOD

(75) Inventors: Erik Roelof Loopstra, Heeze (NL); Engelbertus Antonius Fransiscus Van der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 227 days.

(21) Appl. No.: 11/224,308

(22) Filed: Sep. 13, 2005

(65) Prior Publication Data

US 2006/0227309 A1    Oct. 12, 2006

Related U.S. Application Data

(63) Continuation-in-part of application No. 11/101,631, filed on Apr. 8, 2005, now abandoned.

(51) Int. Cl.
*G01B 11/02* (2006.01)
*G01D 5/36* (2006.01)

(52) U.S. Cl. .................. 356/616; 356/399; 356/500

(58) Field of Classification Search ......... 356/614–623, 356/399–401, 603; 250/559.3, 559.4
See application file for complete search history.

(56) References Cited

U.S. PATENT DOCUMENTS

| | | | | |
|---|---|---|---|---|
| 5,142,146 | A * | 8/1992 | Morokuma | 250/237 G |
| 5,610,715 | A * | 3/1997 | Yoshii et al. | 356/499 |
| 5,757,507 | A * | 5/1998 | Ausschnitt et al. | 356/401 |
| 5,801,832 | A * | 9/1998 | Van Den Brink | 356/500 |
| 5,942,357 | A * | 8/1999 | Ota | 430/22 |
| 5,969,441 | A | 10/1999 | Loopstra et al. | |

(Continued)

FOREIGN PATENT DOCUMENTS

EP    1 111 471 A2    6/2001

(Continued)

OTHER PUBLICATIONS

Dey, Jim "Precision wafer stepper utilizing a two-dimensional optical encoder", SPIE vol. 275, Semiconductor Lithography VI (1981) pp. 29-34.*

(Continued)

*Primary Examiner*—L. G. Lauchman
*Assistant Examiner*—Rebecca C Slomski
(74) *Attorney, Agent, or Firm*—Sterne, Kessler, Goldstein & Fox P.L.L.C.

(57) ABSTRACT

A lithographic apparatus includes a displacement measuring system configured to measure the position of a substrate table in at least three degrees of freedom. The displacement measuring system includes a first x-sensor configured to measure the position of the substrate table in a first direction and a first and a second y-sensor configured to measure the position of the substrate table in a second direction. Said displacement measuring system further comprises a second x-sensor. The first and second x-sensor and first and second y-sensors are encoder type sensors configured to measure the position of each of the sensors with respect to at least one grid plate. The displacement measuring system is configured to selectively use, depending on the position of the substrate table, three of the first and second x-sensors and the first and second y-sensors to determine the position of the substrate table in three degrees of freedom.

23 Claims, 3 Drawing Sheets

U.S. PATENT DOCUMENTS

| | | | |
|---|---|---|---|
| 6,341,007 | B1 | 1/2002 | Nishi et al. |
| 6,417,914 | B1 | 7/2002 | Li |
| 6,781,694 | B2 * | 8/2004 | Nahum et al. ............... 356/420 |
| 6,875,992 | B2 | 4/2005 | Castenmiller et al. |
| 7,161,659 | B2 | 1/2007 | Van Den Brink et al. |
| 2003/0076482 | A1 | 4/2003 | Inoue |
| 2004/0263846 | A1 | 12/2004 | Kwan |
| 2005/0122490 | A1 | 6/2005 | Luttikhuis et al. |
| 2005/0168714 | A1 | 8/2005 | Renkens et al. |
| 2005/0178976 | A1 * | 8/2005 | Steele .................. 250/440.11 |
| 2005/0237510 | A1 | 10/2005 | Shibazaki |
| 2006/0061747 | A1 | 3/2006 | Ishii |
| 2007/0263197 | A1 | 11/2007 | Luttikhuis et al. |

FOREIGN PATENT DOCUMENTS

| | | | |
|---|---|---|---|
| EP | 1 220 037 | A2 | 7/2002 |
| EP | 1 486 827 | A2 | 12/2004 |
| EP | 1 486 827 | A3 | 12/2004 |
| EP | 1 510 870 | A1 | 3/2005 |
| EP | 1 635 382 | A1 | 3/2006 |
| JP | 10-318791 | A | 4/1998 |
| WO | WO 2004/114380 | A1 | 12/2004 |

OTHER PUBLICATIONS

Schäffel et al., "Integrated Electrodynamic Multicoordinate Drives—Modern Components for Intelligent Motions", Proceedings of: The American Society for Precision Engineering—Eleventh Annual Meeting, vol. 14, pp. 456-461 (1996).

Marinus Van Den Brink et al., "Dual Stage Lithographic Apparatus and Device Manufacturing Method", U.S. Appl. No. 11/101,631 filed Apr. 8, 2005, (now Abandoned).

Search Report for European Application No. EP 06 07 5836 mailed Mar. 14, 2007, 6 pgs.

* cited by examiner

LITHOGRAPHIC APPARATUS AND DEVICE MANUFACTURING METHOD

This application is a continuation in part of U.S. patent application Ser. No. 11/101,631, entitled "Dual Stage Lithographic Apparatus And Device Manufacturing Method", filed on Apr. 8, 2005. The content of that application is incorporated herein in its entirety by reference.

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

One of the most challenging requirements for micro-lithography for the production of integrated circuits as well as liquid crystal display panels is the positioning of tables. For example, sub-100 nm lithography demands substrate- and mask-positioning stages with dynamic accuracy and matching between machines to the order of 1 nm in all 6 degrees of freedom (DOF), at velocities of up to 3 m/s.

A popular approach to such demanding positioning requirements is to sub-divide the stage positioning architecture into a coarse positioning module (e.g. an X-Y table or a gantry table) with micrometer accuracies but travelling over the entire working range, onto which is cascaded a fine positioning module. The latter is responsible for correcting for the residual error of the coarse positioning module to the last few nanometers, but only needs to accommodate a very limited range of travel. Commonly used actuators for such nano-positioning include piezoelectric actuators or voice-coil type electromagnetic actuators. While positioning in the fine module is usually effected in all 6 DOF, large-range motions are rarely required for more than 2 DOF, thus easing the design of the coarse module considerably.

The micrometer accuracy required for the coarse positioning can be readily achieved using relatively simple position sensors, such as optical or magnetic incremental encoders. These can be single-axis devices with measurement in one DOF, or more recently multiple (up to 3) DOF devices such as those described by Schaffel et al "Integrated electro-dynamic multicoordinate drives", Proc. ASPE Annual Meeting, California, USA, 1996, p. 456-461. Similar encoders are also available commercially, e.g. position measurement system Type PP281R manufactured by Dr. J. Heidenhain GmbH. Although such sensors can provide sub-micrometer level resolution without difficulty, absolute accuracy and in particular thermal stability over long travel ranges are not readily achievable.

Position measurement for the mask and substrate tables at the end of the fine positioning module, on the other hand, has to be performed in all 6 DOF to sub-nanometer resolution, with nanometer accuracy and stability. This is commonly achieved using multi-axis interferometers to measure displacements in all 6 DOF, with redundant axes for additional calibration functions (e.g. calibrations of interferometer mirror flatness on the substrate table).

However, with the above approach, every time the stage is brought (back) into the range of the fine positioning module, the position of the stage has to be (re)calibrated in six degrees of freedom. This takes a considerable amount of time, and as a result the throughput of the lithographic apparatus is decreased.

As an alternative for interferometers it is known to use optical encoders, possibly in combination with interferometers. Such optical encoders are for instance disclosed in US 2004/0263846 A1, which document is hereby incorporated herein by reference. The optical encoders described in this application make use of a grid plate that comprises a grid pattern which is used to determine the position of a sensor with respect to the grid pattern. In an embodiment the sensor is mounted on the substrate table and the grid plate is mounted on a frame of the lithographic apparatus.

However, the sensor range of such sensor is in principle limited to the size of the grid plate. However, the size of such grid plate is physically limited due to the high resolution required in the grid. Thus, in practice the size of the working area of such sensor is limited. Furthermore, it is possible that holes/openings have to be provided in the gridplate, for instance an opening through which the projection beam can be brought. At the location of such hole/opening, a sensor cannot determine its position. Moreover, it is possible that the grid plate is locally damaged, which may make an accurate determination of the position of a sensor on this position impossible.

SUMMARY

It is desirable to provide a high accuracy displacement measuring system for a lithographic apparatus which is configured to measure the position of the substrate table in all possible locations making continuous measurement of the position of the substrate table possible.

According to an embodiment of the invention, there is provided a lithographic apparatus comprising:
  a substrate table for holding a substrate;
  a projection system for projecting a patterned beam onto a target portion of the substrate; and
  a displacement measuring system configured to measure a position of the substrate table, wherein the displacement measuring system comprises at least one encoder type x-sensor mounted on the substrate table and configured to measure the position of the substrate table in a first direction with respect to two or more substantially stationary adjacent grid plates, the displacement measuring system being configured to continuously measure the position of the substrate table when crossing a crossing line between the two or more adjacent grid plates.

According to an embodiment of the invention, there is provided a lithographic apparatus comprising:
  a substrate table for holding a substrate;

a projection system for projecting a patterned beam onto a target portion of the substrate; and a displacement measuring system configured to measure the position of the substrate table in six degrees of freedom (x, y, z, Rx, Ry, Rz), wherein the displacement measuring system comprises:

one x-sensor configured to measure the position of the substrate table in a first direction, two y-sensors configured to measure the position of the substrate table in a second direction, and three z-sensors configured to measure the position of the substrate table in a third direction, wherein the displacement measuring system further comprises a second x-sensor and a fourth z-sensor, wherein the first and the second x-sensor and the first and second y-sensors are encoder type sensors configured to measure the position of each of the sensors with respect to at least one grid plate, the displacement measuring system being configured to selectively use, depending on the position of the substrate table, three of three first and second x-sensors and the first and second y-sensors and three of the z-sensors to determine the position of the substrate table in six degrees of freedom.

According to an embodiment of the invention, there is provided a device manufacturing method comprising projecting a patterned beam of radiation onto a substrate, wherein the substrate is supported on a substrate table at least during projecting a patterned beam onto a target portion of the substrate, wherein the position of the substrate table is measured by a displacement measuring system comprising at least one encoder-type sensor mounted on the substrate table and being configured to measure the position of the substrate table in a first direction with respect to two or more substantially stationary adjacent grid plates, the displacement measuring system being configured to continuously measure the position of the substrate table when crossing a crossing line between the two or more adjacent grid plates.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
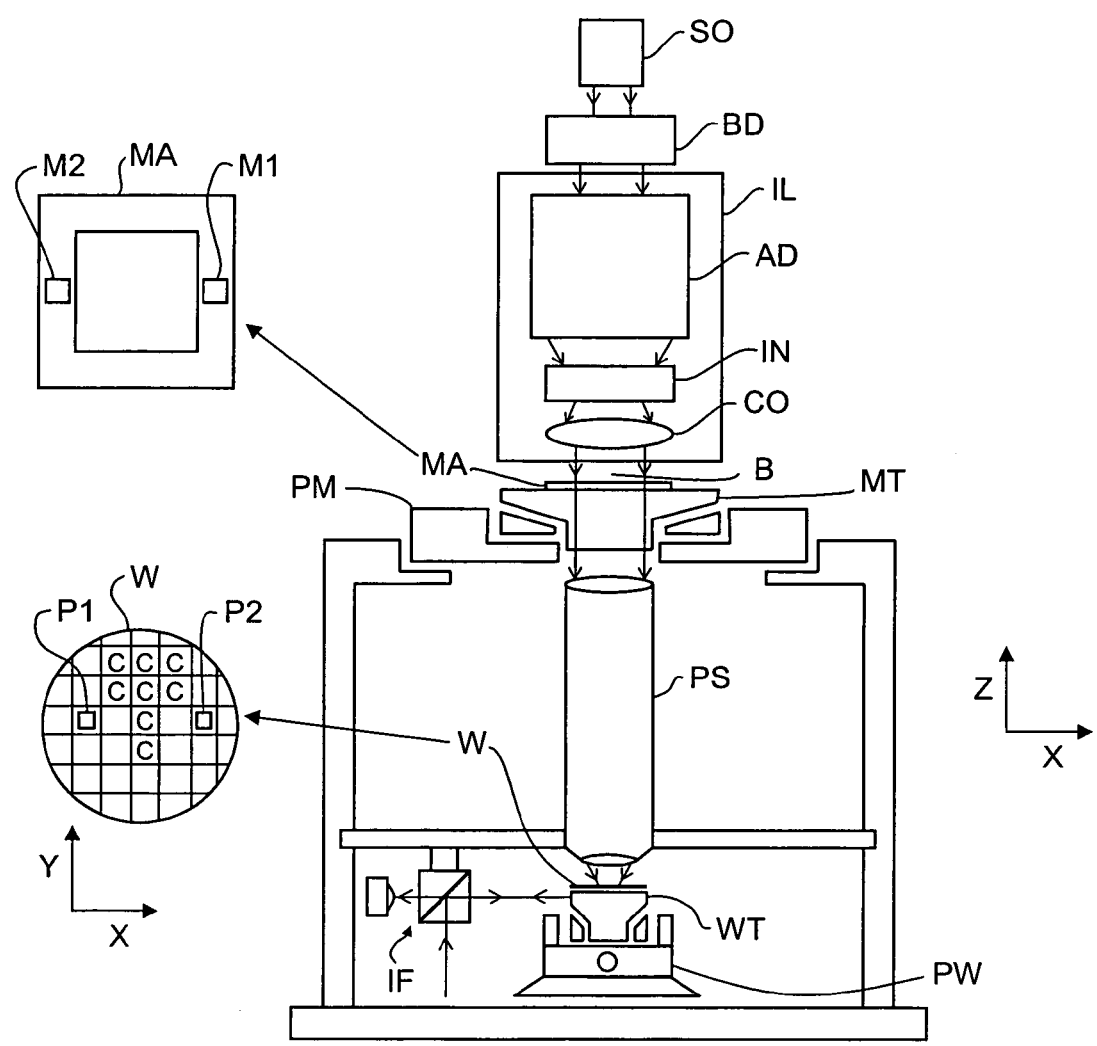
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
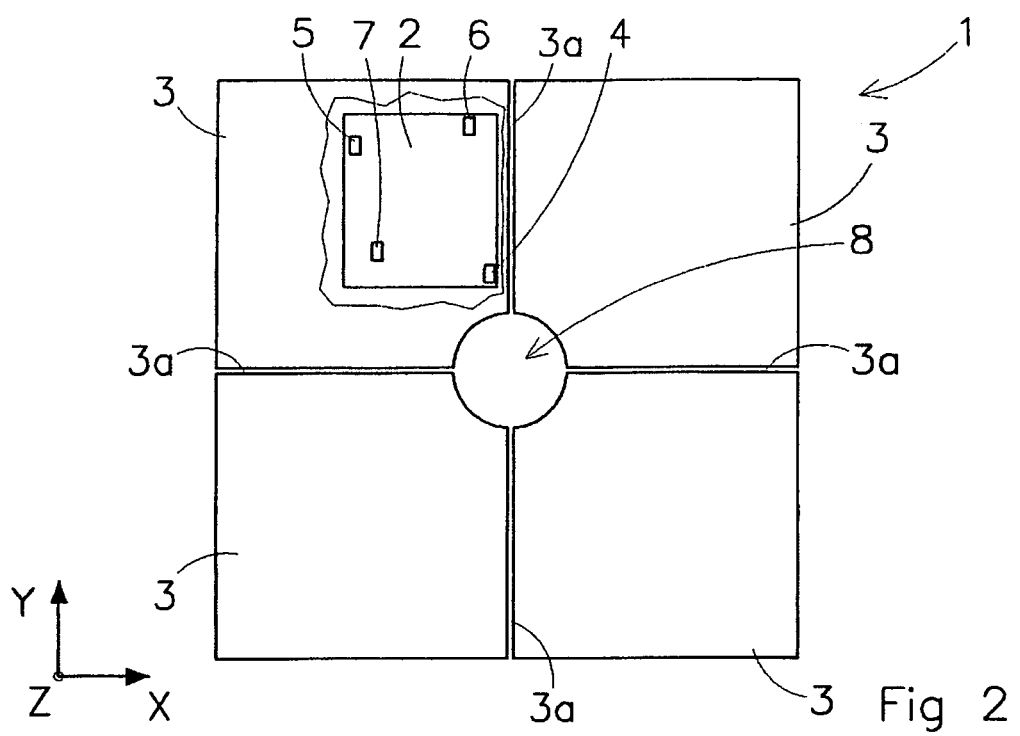
FIG. 2 depicts a first embodiment of a measuring system according to the invention.

FIG. 2 shows a first embodiment of a displacement measuring system according to the invention. The displacement measuring system is generally indicated with the reference numeral 1. The displacement measuring system 1 is designed to measure the position of a substrate table 2 in three coplanar degrees of freedom, namely the x-position, the y-position, and the rotation about the z-axis Rz (the z-axis is the axis perpendicular to the x and y axis shown in the drawing.)

The displacement measuring system 1 comprises four adjacent grid plates 3 which are mounted on the lithographic apparatus, for instance on a frame such as the so-called metrology frame or on the lens. The grid plates 3 are substantially flat plates which are arranged in substantially the same plane which extends in the directions of the x-axis and the y-axis. The four grid plates 3 are adjacent meaning that at least one side of each grid plate is placed against or at least with a side of another grid plate 3. Together, the four grid plates 3 cover substantially all required locations of the substrate table 2, so that the measuring system 1 is continuously capable of measuring the position of the substrate table 2.

In the present embodiment the substrate table 2 is arranged under the grid plates 3. On the substrate table 2 two x-sensors 4, 5 and two y-sensors 6, 7 are arranged. The x-sensors 4, 5 can measure the position of the substrate table in the x-direction. The y-sensors 6, 7 can measure the position of the substrate table 2 in the y-direction. The signals of one pair of the two x-sensors and two y-sensors (x, x; x, y or y,y) may be used to determine the rotation about the z-axis (rotation in the x-y plane). Thus, with three of the two x-sensors 4, 5 and y-sensors 6, 7 it is possible to determine the position of the substrate table in three coplanar degrees of freedom (x,y, Rz) in all possible locations of the substrate table 2. As a consequence, continuous high accuracy measurement (nanometer or sub-nanometer resolution) of the substrate table 2 is possible.

The x-sensors 4, 5 and the y-sensors 6, 7 are of the encoder type which can determine the position of the respective sensor with respect to the grid which is arranged on the grid plates 3. Each of the x-sensors and y-sensors may for instance be designed as described in the US application US 2004/0263846 A1, which document is hereby incorporated herein by reference.

In the present embodiment four grid plates are used as the physical dimensions of the grid plates 3 is limited. It is practically very difficult or at least very expensive to produce grid plates of the size of the working area having a grid with the resolution to obtain the accuracy needed for the present application. As the working range used by the substrate table is substantially larger than the physical maximum size of such grid plate 3, the working area is subdivided in four areas, each having its own grid plate 3.

As indicated above the grid plates 3 are arranged adjacent. This makes a sensor take-over from one grid plate 3 to another grid plate 3 possible. During such sensor take-over, i.e. a sensor first cooperating with a first grid plate 3 and thereafter with a second grid plate 3, another sensor may provide a signal to make continuous measurement possible. When the first sensor is in the range of the other grid plate 3, possibly after re-initialisation, this sensor may again provide a signal representative for the position of the substrate table.

Although the subdivision of the working area in four sub-areas each having its own grid plate 3 makes it possible to cover all required locations of the substrate table 2 in a relative efficient way, the crossings between the grid plates 3 makes a continuous measuring of the position of the substrate table 2 with a single sensor difficult. Also, the presence of a hole or opening (for instance opening 8 which can receive a part of the projection system in the center of the four grid plates 3), or a damaged area in the grid plate 3 may cause that a single sensor on that location is not capable of measuring the position of the substrate table 2 with respect to one of the grid plates 3.

As described above three of the two x-sensors 4, 5 and y-sensors 6, 7 make it possible to determine the position of the substrate table in three coplanar degrees of freedom. There is thus one redundant sensor. This extra sensor can beneficially be used in the case one of the other sensors cannot be used since it is outside the range of the grid plates 3. For instance, it is possible that one of the x-sensors or y sensors is positioned directly under the crossing of one grid plate 3 to another grid plate 3. In such case the respective sensor (for instance when x-sensor 4 is located under crossing line 3 between the two grid plates 3, if substrate table 2 is moved in the x direction) cannot deliver a signal representative for the x-position or the y-position of the substrate table 2. However, the other three sensors, (in the example x-sensor 5 and y-sensors 6, 7) can determine the position of the substrate table 2 in three coplanar degrees of freedom, thus maintaining continuous high accuracy displacement/position measurement.

When the substrate table 2 is moved further in the x-direction, the first x-sensor 4 is moved under another grid plate 3 (in the example the grid plate 3 at the top right hand side of FIG. 2). Then, the x-sensor 4 may, after re-initialization, again provide a signal which is representative for the x-position of the substrate table 2. However, the y-sensor 6 may now be located under the crossing of the two grid plates 3. This y-sensor 6 can in that situation not be used for obtaining a signal representative for the y-position of the substrate table 2. However, since the x-sensor 4 is now located under one of the grid plates 3, this x-sensor 4 can be used in combination with the x-sensor 5 and the y-sensor 7 to determine the position of the substrate table 2 in three degrees of freedom. By selectively using the set of three sensors which can each properly determine a signal representative for the position in the x-direction or y-direction, continuous control is obtained. The selection of the respective x-sensors and y-sensors may be performed by a selection device. The selection/choice of the respective grid plate 3 is dependent by the position of the substrate table. When all four sensors can deliver a signal, the redundant signal may for instance be used for calibration of the measuring system.

In the present embodiment the grid plates 3 are substantially rectangular plates, which are placed against each other. The sides of these plates are oriented in the x-direction and the y-direction. It is therefore preferable that the two x-sensors 4,5 and the two y-sensors 6,7 are spaced (in the x-y-plane) with respect to each other in the x-direction and the y-direction. In other words, in this embodiment of the substrate table 2, the arrangement of the x-sensors 4,5 and that y-sensors 6,7 is such that none of the four sensors 4, 5, 6, 7 is arranged on the same line in the x-direction and none of the four sensors 4,5,6,7 is arranged on the same line in the y-direction. In this way only one of the four sensors will be outside the range of a grid plate 3 when crossing a crossing line 3a in the x-direction or the y-direction.

In an alternative embodiment it is possible that the sides of the grid plates which are positioned against each other are not arranged in the x-direction and y-direction, but in one or more other directions in the x-y plane. These other directions are herein defined as the grid plate crossing line directions. In such case it is preferred that the two x-sensors 4,5 and the two y-sensors 6,7 are spaced with respect to each other in one or more of these crossing line directions.

Further, it is remarked that it may be possible that in certain theoretical within the working range of the substrate table 2 more than one of the two x-sensors 4, 5 and/or y-sensors 6, 7 are at the same time not capable of determining the position of the respective sensor with respect to one of the grid plates 3. For instance it is possible that one x-sensor is located under a crossing line of the grid plates 3 in the x-direction, while the other x-sensor is located under a crossing line which runs in the y-direction. Such situation is highly undesirable, as this would result in only two sensors being capable of determining the position of the substrate table 2. As a consequence the position of the substrate table 2 cannot anymore be derived in two degrees of freedom.

The above undesired situation may be avoided by providing more redundant sensors which are located on different positions of the substrate table 2. Another solution for this situation is to limit the movements of the substrate table in such a way that, in the present embodiment, the substrate table 2 may only cross one crossing line direction at a single time, or that at least may not be brought in positions of which it is known that the above situation will not occur. The latter solution is generally preferred as the provision of more sensors will increase costs and the weight of the substrate table 2.

In both solutions it is therefore guaranteed that the measuring system will be able to determine the position of the substrate table 2 in all possible locations of the substrate table 2 during use of the lithographic apparatus. These locations comprise for instance a range for exposures, a range to move to and from the exposure range, a range for exchanging the substrates and a range for miscellaneous functions, alignment and such.

Figure 3:
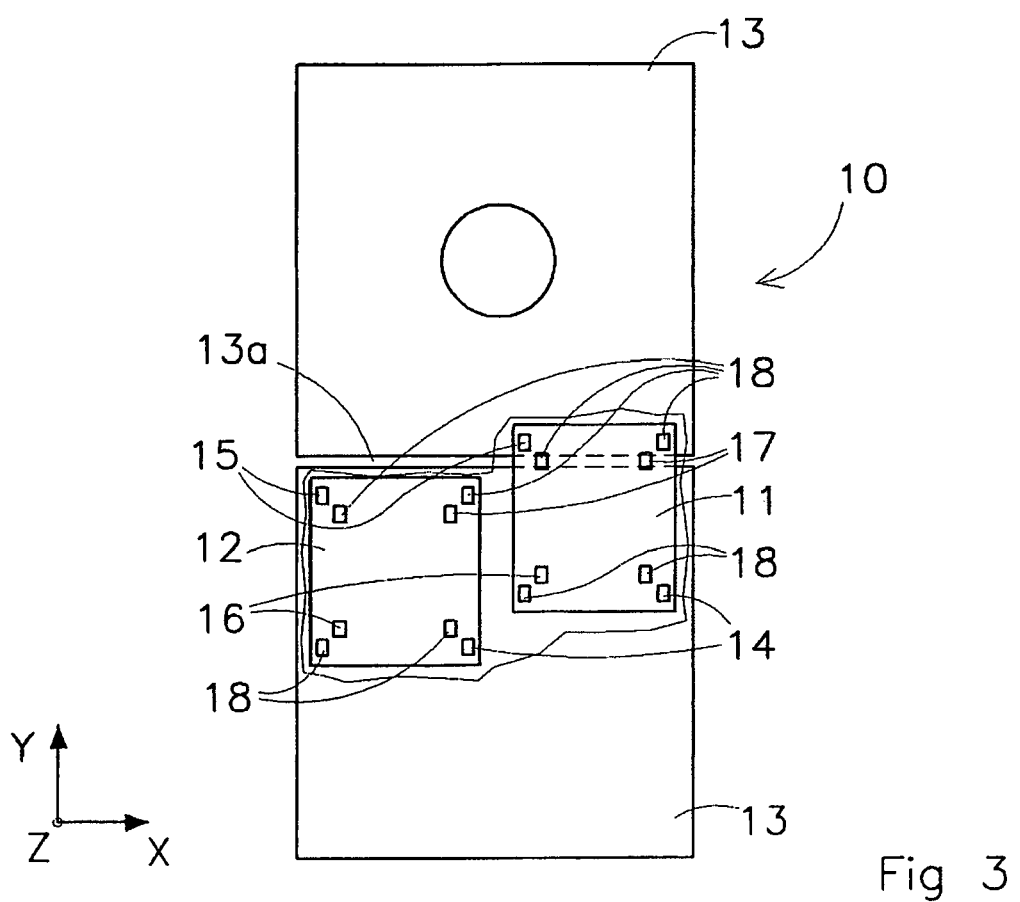
FIG. 3 depicts a second embodiment of a measuring system according to the invention.

FIG. 3 shows a measuring system 10 according to an embodiment of the present invention. In this embodiment the measuring system is configured to determine the position of two substrate tables 11, 12 on a high accuracy level. On each substrate table 11, 12 the same amount and type of sensors are mounted to obtain a position of the substrate table 11, 12 in six degrees of freedom. The substrate tables 11, 12 are positioned under one or both of the two grid plates 13. These grid plates 13 cover substantially the whole working area of the substrate tables 11, 12 so that the measuring system 10 may continuously determine the position of the substrate tables 11 and 12 on a high accuracy level in six degrees of freedom. As the substrate tables 11, 12 are both directly positioned under the grid plates 13 which are used to determine the position of each of the substrate tables in six degrees of freedom, the measurement of the position of each of the substrate tables 11, 12 is not hindered by the other of the substrate tables 12, 11. Therefore, the measuring system 10 according to the embodiments of the present invention is very suitable to determine the position of substrate tables in a so-called "dual stage lithographic apparatus" having two substrate tables.

Each of the substrate tables 11, 12 comprises two x-sensors 14, 15 and two y-sensors 16, 17 to determine the position of the respective substrate table 11, 12 in three (coplanar) degrees of freedom (x, y, Rz) as explained with respect to the embodiment of FIG. 2. One of two x-sensors and two y sensors is redundant as the three degrees of freedom may be determined on the basis of three sensor signals. Furthermore, each substrate table 11, 12 comprises four z-sensors 18 to determine the position of the substrate table in z position. With the signals of three of these four z-sensors 18 three further degrees of freedom may be determined, namely the x-position, the rotation about the x axis (Rz), and the rotation about the y-axis (Ry).

The encoder-type x-sensors 14, 15 and y-sensors 16, 17, may be of the type described hereinabove in relation to the embodiment of FIG. 2. The z-sensors 18 are preferably interferometers but may be of any suitable type as discussed hereinafter.

As there are four z-sensors 18 provided on each of the substrate tables 11, 12, one of the z-sensors is redundant. Thus in the case that one of the two x-sensors 14, 15 and the two y-sensors 16, 17 and one of the four z-sensors 18 cannot determine its position with respect to the grid plates 13, the position of the substrate table 11, 12 can still be determined in six degrees of freedom.

Further, in order to make crossings over crossing line 13a in the x-direction as shown in FIG. 3 possible, the x-sensors 14,15 and the y-sensors 16, 17 are arranged in such a way that each of these four sensors 14, 15, 16, 17 is spaced in the x-y-plane from the other three in a direction perpendicular to the direction of the crossing line 13a, in the present embodiment the former direction being the y-direction and the latter direction being the x-direction. Also, to make crossings over crossing lines in the y-direction possible, each of these four sensors 14, 15, 16, 17 is spaced form the other three in a direction perpendicular to the y-direction of such crossing line. It is remarked that the latter arrangement of the sensors 14, 15, 16, 17 is not strictly necessary in the present embodiment as there are no crossing lines in the y-direction.

Also and for the same reasons each one of the four z-sensors 18 is spaced in the x-y plane from the other z-sensors 18 in both the direction perpendicular to the x-direction as the direction perpendicular to the y-direction. In this way when a crossing line in the x-direction or the y-direction (the latter not present in the embodiment shown in FIG. 3) is crossed, maximal one of the z-sensors 18 will not be able to determine its position with respect to the grid grating on the grid plates 13.

The x-sensors 14, 15, y-sensors 16, 17 and z-sensors 18 are arranged on the corners of an inner rectangle and an outer rectangle, whereby on the four corners of each rectangle a x-sensor 14, 15, a y-sensor 16, 17 and two z-sensors 18 are placed, the z-sensors being placed in opposed corners. Furthermore, the z-sensors of the inner rectangle are placed in different corners than the z-sensors of the outer rectangle. With this arrangement each of the two x-sensors and two y-sensors is spaced in the x-y plane from the other of the x-sensors and y-sensors in both the direction perpendicular to the x-direction as the direction perpendicular to the y-direction, and also each of the z-sensors 18 is spaced in the x-y plane from the other z-sensors 18 in both the direction perpendicular to the x-direction as the direction perpendicular to the y-direction. Furthermore this arrangement needs a relative small amount of space on the substrate table 11, 12. In this arrangement it is preferred that the X and Y sensors are arranged on the maximum distance arrangement so that the Rz measurement can be made most accurately.

Figure 4:
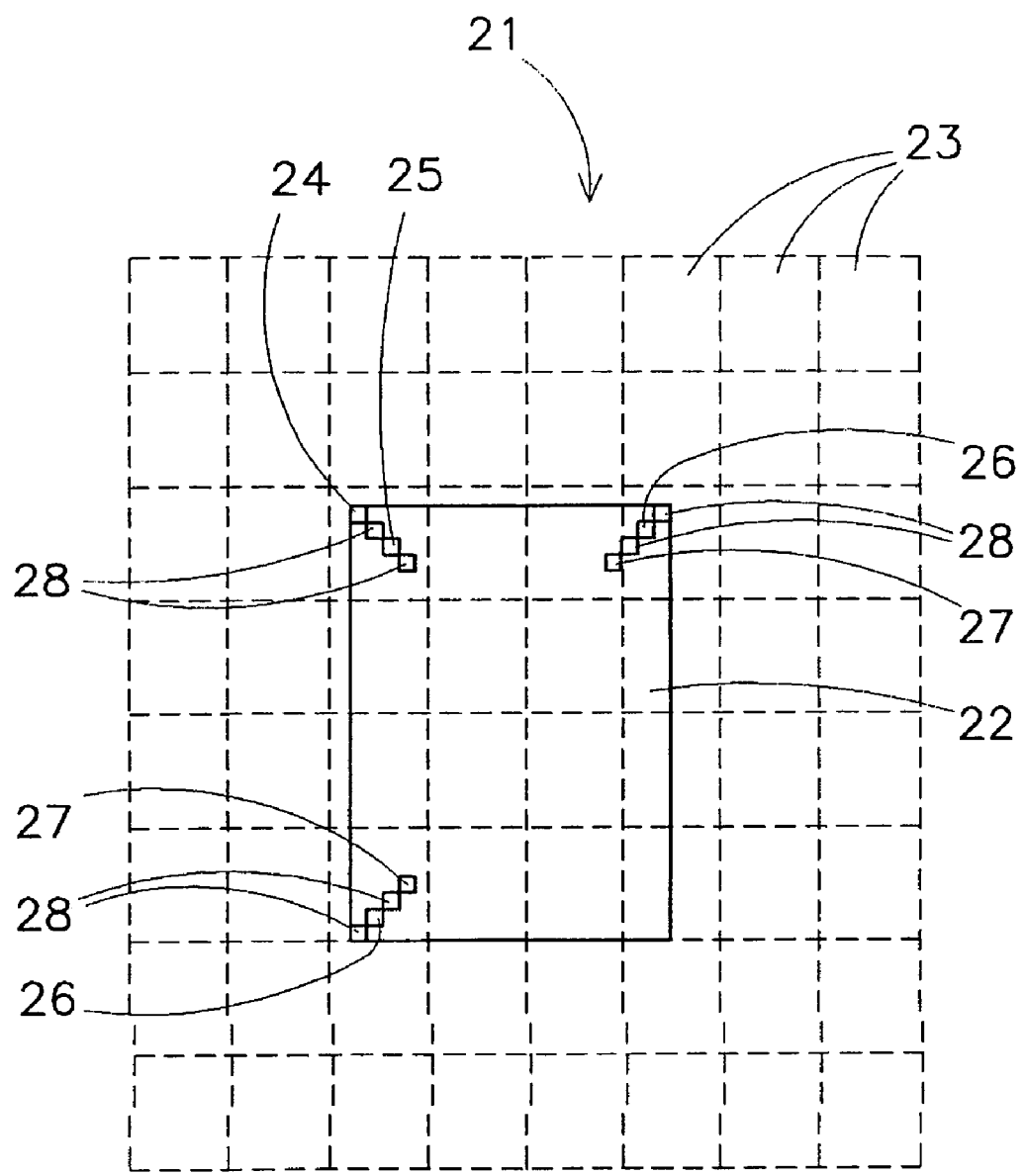
FIG. 4 depicts a third embodiment of a measuring system according to the invention.

FIG. 4 shows a measuring system 21 according to an embodiment of the present invention using encoder-type sensors to measure the position of a substrate. In this embodiment the grid grating is formed by a larger number of grid plates 23 (only three are indicated with this reference numeral 23 for clarity reasons) which cover a whole working area of the substrate table 22. The grid plates are shown in dashed lines to The grid plates 23 may for instance be wafers on which a grid grating is provided. Such wafers are limited in size (typically 300 mm), but the grating can with a lithographic exposure process be provided on the wafers with a very high accuracy. However, since the sizes of the grid plates 23 are limited another arrangement of the sensors on the substrate table 22 may be preferred, as will be explained.

The substrate table 22 comprises six sets of two sensors (two sets for each corner), in total two x-sensors 24, 25, four y-sensors 26, 27 and six z-sensors 28, so that substrate table 22 comprises a redundant sensor for each sensor present on the substrate table 22.

In each of three corners of the substrate table 22, the substrate table 22 comprises two x-sensors 24, 25 or two y-sensors 26, 27 and two z-sensors 28, i.e. two sensor sets, each set comprising a x-sensor 24, 25 or a y-sensor 26, 27 and a z-sensor 28. Preferably, all four sensors are arranged within an area which is smaller than the area of one grid plate 23. If one of the four sensors on a corner of the substrate table 22 cannot determine its position with respect to the grid grating the corresponding other of the four sensors may be used to determine the position of the substrate table 22. For instance when one of the x sensors 24, 25 is located under a crossing line the other x-sensor 25, 24 may be used for determining the x-position of the substrate table 22.

The four sensors in each corner are beneficially arranged in such a way that all four sensors arranged in a single corner are spaced from each other in the x-y plane in the directions perpendicular to both the x-direction and the y-direction.

Moreover, the x-sensors or y-sensors in one corner are aligned with z-sensors in another corner, so that when for instance a crossing line in the x-direction is crossed by the substrate table a maximum of two sensors crosses this line at the same time, whereby one of the sensors is a x-sensor or a y-sensor and the other sensor is a z-sensor.

For even more redundancy and as a result more robustness of the measuring system 21 further sensors may be provided on the substrate table 22. In particular, in the fourth corner of the substrate table 22 two further x-sensors and two further z-sensors may be provided.

The x-sensors, y-sensors and z-sensors may further be designed as described in relation to the embodiments of FIG. 2 and FIG. 3.

A typical system used in the present invention comprises a grid grating with a period of 2 [mu]m or less, with an interferential reading (encoder) head in 2 DOF and an interpolator of up to a factor of 20,000 for each axis.

For the measurement of the remaining 3 DOF, namely Z, Rx and Ry, various short range displacement sensing technologies can be employed, including optical triangulation, fiber optic back-scatter, interferometric sensors (which can have a very short optical path in air and therefore be much less sensitive to environmental fluctuations), capacitive or inductive sensors.

Currently, capacitive and optical sensors are preferred to the other measuring principles, though the others may be appropriate in some applications of the invention. The use of inductive sensors against a Zerodur chuck is problematic, as conductive targets are required for the sensors. Pneumatic proximity sensors (air micrometer), on the other hand, suffer from limited resolution and working distance, as well as exerting a finite force on the target.

Optical sensors, whether interferometric or triangulated, can be designed with a relatively large (a few millimeters) working distance, which helps to ease assembly tolerances. Compared to capacitive sensors, they usually have higher bandwidths, and can be configured as an absolute distance sensor. As an absolute sensor, however, they do suffer from long-term stability problems due to mechanical drifts (thermal or otherwise) requiring periodic calibration.

Capacitive sensors, on the other hand, can be designed as an absolute sensor with very high stability. Furthermore, the distance measurement is performed over a relatively large target surface, which helps to reduce any effects of localized unevenness of the target surface.

An encoder based nano-positioning system offers an advantageous alternative to interferometry and is much simpler to implement. Better measurement stability can for instance be achieved by the fact that the measurement grid in the X-Y plane is permanently fixed onto the metrology frame, which when implemented in a zero-CTE material, such as Zerodur, is both long-term dimensionally stable and thermally insensitive. This eases considerably the stringent demand on environmental control of the area immediately around the optical path of the interferometer beams, particularly in the case of a lithographic projection apparatus employing wavelengths of 157 nm or below. Such devices require to be purged with gas, that does not absorb the beam (which is strongly absorbed in air), and by avoiding the need for air showers over the length of the interferometer beams, embodiments of the present invention can substantially reduce consumption of purge gas.

The mask position relative to the projection optics can also be measured in the encoder solution without resorting to a differential configuration. Although placing the reading head directly on the top of the projection optics does put more demands on the thermal dissipation of the former, techniques to minimize this such as active cooling or remote light source and detectors linked by optical fibers are already available and already deployed in state-of-the-art interferometer systems.

The encoder based nano-positioning system may also be arranged as follows: A first sensor head is arranged on the substrate table, and a first grating is mounted on the projection system or on a frame. In one embodiment, such a frame is at least substantially stationary relative to the projection system, which means that the relative displacement of the projection system and the part of the frame the first grating is attached to is negligible. If this cannot be achieved, it is envisaged that displacement of the frame relative to the projection system is measured as well. It is also envisaged that in case the frame is deemed to be substantially stationary, displacement of the frame relative to the projection system is measured as well, in order to make sure that the relative displacement actually is negligible.

The first sensor head can be mounted on top of the substrate table, facing upwards to the first grating, which is mounted on the projection system or on the frame. The sensor head and the first grating are arranged in such a way that during all movements of the substrate table, the first sensor head and the first grating are able to cooperate in measuring displacement of the substrate table relative to the projection system.

In such an arrangement, the measurement system may also comprise a first z-sensor. The z-sensor and the first grating cooperate in determining the displacement of the substrate table relative to the projection system in a third direction of measurement which is perpendicular to a plane defined by the first direction of measurement and the direction of the lines of the first grating. For example, when the first direction of measurement is the x-direction and the sensor head sends the polarized beam of radiation in z-direction to the first grating, the lines of the first grating extend in y-direction. In that case, the plane defined by the first direction of measurement and the direction of the lines of the first grating is the x-y-plane. In that case, the third direction of measurement is the direction perpendicular to the x-y-plane, thus the z-direction. So, in this situation the first grating is not only used for measuring displacement of the substrate table relative to the projection system. in x-direction, but also for measuring displacement of the substrate table relative to the projection system in z-direction.

It is envisaged that the z-sensor can be an interferometer, and that the first grating has a reflective face cooperating with the interferometer. It is possible that the grating comprises two, mutually parallel reflective faces, for example due to the nature of the grating. This can be the case if the grating comprises two groups of parallel lines. In such a case, the difference in optical length path between reflection upon the first and second surface (or between the reflective faces) is preferably N times the wavelength of the beam of the interferometer, N being a positive integer (1, 2, 3, 4, . . . ).

Alternatively, the z-sensor can be a capacitive sensor. For functioning, a capacitive sensor needs an electrically conductive counter plate, that is arranged at a small distance, such as a few millimeters, from the capacitive sensor in the direction of measurement. By making at least a part of the first grating electrically conductive, the first grating serves as a counter plate for the capacitive sensor. It is known to make gratings out of glass, with lines of chromium. By interconnecting the lines and connecting them to ground, such a grating can be used with a capacitive sensor.

In the lithographic projection system according to an embodiment of the invention, the number of interferometers used for measuring the displacements of the substrate table relative to the projection system is reduced. This way, the costs of both the measurement system and the substrate table are reduced. It is envisaged that the displacements of the substrate table relative to the projection system in both the first direction and the second direction are measured using sensor heads or reading heads. In this embodiment, the lithographic apparatus is equipped with a measurement system comprising a first sensor head and a second sensor head. To this end, the first grating may include not only a first group of mutually parallel lines, extending perpendicular to the first direction of measurement and but also a second group of mutually parallel lines, extending perpendicular to the second direction of measurement. The first grating may be provided with a checkerboard pattern, for use in association with both the first and the second sensor head. In that case, the transitions between the light and the dark areas of the checkerboard pattern take over the role of the parallel lines of the grating. Alternatively, a separate second grating may be present for use by the second sensor head. The first and the second sensor head are preferably integrated in a single sensor unit.

In another embodiment, the measurement system is adapted to measure displacements of the substrate table relative to the projection system in all three degrees of freedom in the plane defined by the first and the second direction of measurement by using sensor heads. If this plane is the x-y-plane, this means that the translational displacements of the substrate table in the x-direction and in the y-direction and the rotational displacement about an axis in z-direction are measured using sensor heads.

For this purpose, the measurement system comprises in this embodiment a first, a second and a third sensor head. Two of these sensor heads are used for measuring the displacements of the substrate table in the first direction of measurement and the other encoder is used for measuring the displacements of the substrate table in the second direction of measurement. It will be appreciated that this can also be the other way around. The sensor heads are arranged at known relative distances, so that any rotation of the substrate table around an axis extending in the third direction of measurement can be determined based on the sensor head measurements.

It is possible that each sensor head is associated with its own grating, which means that in that case the measurement system comprises a first, a second and a third grating. However, in certain embodiments, at least two sensor heads share a grating, which is suitable for measurements in two directions, for example due to the presence of a checkerboard pattern.

It is envisaged that the measurement system for measuring displacements of the substrate table relative to the projection system in all three degrees of freedom in the plane defined by the first and the second direction of measurement using sensor heads as described above is used without a z-sensor. In that case, the sensor heads are mounted onto the substrate table.

In a further alternative embodiment, the measurement system is provided with a first, a second and a third z-sensor. These z-sensors are arranged at known relative positions, so that any rotation of the substrate table around the first direction of measurement and around the second direction of measurement can be determined by their measurements. Preferably all z-sensors cooperate with a grating in measuring the displacements of the substrate table relative to the projection system. This results in a measurement system capable of positional measurement in 6 degrees of freedom (6 DOF).

Hereinabove measuring systems for the determination of the position of the position of a substrate table have been described. Such measuring system may however be used for any other movable object of which the position is to be determined on a high accuracy level. In this respect the measuring system is may successfully be used for the determination of the position of a patterning device support in a lithographic apparatus. In particular, the system may be used to determine the position of a patterning device support on a high accuracy level in six degrees of freedom. All features of the measuring system of the measuring systems described may also be applied in measuring system for other movable objects, such as the patterning device support.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a substrate table configured to hold a substrate;
a projection system configured to project a patterned beam onto a target portion of the substrate; and
a displacement measuring system configured to measure a position of said substrate table, wherein said displacement measuring system comprises at least one encoder type x-sensor mounted on said substrate table and configured to measure the position of the substrate table in a first direction with respect to two or more substantially stationary adjacent grid plates, said displacement measuring system being configured to continuously measure the position of said substrate table when crossing a crossing line between said two or more adjacent grid plates.

2. The lithographic apparatus of claim 1, wherein said two or more grid plates cover all possible locations of said substrate table, so that continuous position measurement of said substrate table is possible.

3. The lithographic apparatus of claim 1, wherein said displacement measuring system comprises a second encoder-type x-sensor mounted on said substrate table and configured to measure the position of the substrate table in said first direction with respect to said two or more adjacent grid plates, said displacement measuring system being configured to selectively use, depending on the position of said substrate table, one of said first and second x-sensors to determine the position of said substrate table in said first direction.

4. The lithographic apparatus of claim 3, wherein said displacement measuring system is configured to measure the position of said substrate table in at least three coplanar degrees of freedom (x, y, Rz), wherein said displacement measuring system further comprises:
a first and a second encoder-type y-sensor mounted on said substrate table and configured to measure the position of the substrate table in a second direction with respect to said two or more adjacent grid plates,
said displacement measuring system being configured to selectively use, depending on the position of said substrate table, three of said first and second x-sensors and said first and second y-sensors to determine the position of said substrate table in said three degrees of freedom.

5. The lithographic apparatus of claim 4, wherein each of said x-sensors and y-sensors is spaced from the other of the said x-sensors and y-sensors at least in a direction perpendicular to the direction of said crossing line.

6. The lithographic apparatus of claim 4, wherein each of said x-sensors and y-sensors is spaced from the other of the said x-sensors and y-sensors at least in a direction perpendicular to said first and/or said second direction.

7. The lithographic apparatus of claim 4, wherein said displacement measuring system comprises four z-sensors to measure the position of the substrate table in a direction perpendicular to the first and the second direction, said displacement measuring system being configured to selectively use, depending on the position of said substrate table, three of said four z-sensors to determine the position of said substrate table in three further degrees of freedom (z, Rx, Ry).

8. The lithographic apparatus of claim 7, wherein each of said four z-sensors is spaced from the other of said z-sensors in at least a direction perpendicular to the direction of said crossing line.

9. The lithographic apparatus of claim 7, wherein each of the z-sensors is spaced from the other three z-sensors in at least a direction perpendicular to the first and/or second direction.

10. The lithographic apparatus of claim 7, wherein said z-sensors are interferometers.

11. The lithographic apparatus of claim 7, wherein in each corner of said substrate table one of said first and second x-sensors or said first and second y-sensors and one of said four z-sensors are mounted.

12. The lithographic apparatus of claim 7, wherein said two x-sensors, two y-sensors and four z-sensors are arranged on the corners of an inner and outer rectangle, each rectangle comprising a x-sensor, a y-sensor and two z-sensors, the z-sensors being arranged on opposed corners of said inner rectangle and on the other two opposed corners of said outer rectangle.

13. The lithographic apparatus of claim 1, wherein said lithographic apparatus comprises two or more substrate tables, wherein on each of these substrate tables at least one x-sensor is mounted.

14. The lithographic apparatus of claim 7, wherein on each of at least three locations of said substrate table two sensor sets are arranged, each sensor set comprising a x-sensor or y-sensor, and a z-sensor.

15. The lithographic apparatus of claim 1, wherein the dimensions of said at least one grid plate in said first and second direction are smaller than the dimensions of said substrate table in said first and second direction.

16. The lithographic apparatus of claim 1, wherein said each of said two or more grid plates is a wafer, on which a grid grating is provided.

17. A lithographic apparatus comprising:
a substrate table configured to hold a substrate;
a projection system configured to project a patterned beam onto a target portion of the substrate; and
a displacement measuring system configured to measure the position of said substrate table in six degrees of freedom (x, y, z, Rx, Ry, Rz), wherein said displacement measuring system comprises:
one x-sensor configured to measure the position of the substrate table in a first direction,
two y-sensors configured to measure the position of the substrate table in a second direction, and
three z-sensors configured to measure the position of the substrate table in a third direction, wherein said displacement measuring system further comprises a second x-sensor and a fourth z-sensor, wherein said first and said second x-sensor and said first and second y-sensors are encoder type sensors configured to cooperate with respect to two or more separate grid plates, said displacement measuring system being configured to selectively use, depending on the position of said substrate table with respect to the two or more separate grid plates, three of said first and second x-sensors and said first and second y-sensors and three of said z-sensors to continuously determine the position of said substrate table in six degrees of freedom when the substrate table crosses a space between the two or more separate grid plates.

18. A device manufacturing method comprising:
projecting a patterned beam of radiation onto a substrate, wherein said substrate is supported on a substrate table at least during projecting a patterned beam onto a target portion of the substrate; and
measuring a position of said substrate table, the measuring including measuring the position of said substrate table in a first direction with respect to two or more substantially stationary adjacent grid plates using at least one encoder-type sensor mounted on said substrate table, the measuring further including continuously measuring the position of said substrate table when crossing a crossing line between said two or more adjacent grid plates.

19. The method of claim 18, wherein said two or more adjacent grid plates cover all possible locations of said substrate table making continuous measurement of the position of said substrate table possible.

20. The method of claim 18, further comprising:
measuring the position of the substrate table with respect to said two or more adjacent grid plates with a second encoder-type sensor mounted on the substrate table in the same direction as the first encoder type sensor, and
if one of said encoder-type sensors is located in a position in which it cannot determine its position with respect to the two or more adjacent grid plates, determining the position of said substrate table on the basis of the signal of the other encoder-type sensor.

21. The method of claim 18, further comprising measuring the position in at least three degrees of freedom (x, y, Rz), the measuring in at least three degrees of freedom including:
measuring the position of the substrate table in a first direction using a first and a second x-sensor,
measuring the position of the substrate table in a second direction using a first and a second y-sensor,
wherein said x-sensors and said y-sensors are encoder type sensors configured to measure the position of each of said sensors with respect to said two or more adjacent grid plates,
wherein, if one of the x-sensors or y-sensors is located in a position in which it cannot determine its position with respect to the at least one grid plate, the position of said substrate table is determined in three degrees of freedom on the basis of signals of the other three of said first and said second x-sensor and said first and second y-sensors.

22. The method of claim 21, wherein the movements of the substrate table are limited in such a way that only one of said two x-sensors and two y-sensors may be located in a position of which it is known that the respective sensor cannot determine its position with respect to the at least one grid plate.

23. The method of claim 21, further comprising measuring the position of said substrate in six degrees of freedom, the measuring in six degrees of freedom including measuring the position of said substrate table in a third direction using four z-zensors, wherein, if one of the z-sensors is located in a position in which it cannot determine its position with respect to the at least one grid plate, the position of said substrate table is determined in three further degrees of freedom (z, Rx, Ry) on the basis of signals of the other three of said four z-sensors.

* * * * *